United States Patent
Yamaguchi et al.

(10) Patent No.: US 8,293,370 B2
(45) Date of Patent: Oct. 23, 2012

(54) BONDING MATERIAL, BONDED PORTION AND CIRCUIT BOARD

(75) Inventors: Atsushi Yamaguchi, Osaka (JP); Kazuhiro Nishikawa, Osaka (JP); Hidenori Miyakawa, Osaka (JP)

(73) Assignee: Panasonic Corporation, Osaka (JP)

(*) Notice: Subject to any disclaimer, the term of this patent is extended or adjusted under 35 U.S.C. 154(b) by 780 days.

(21) Appl. No.: 12/376,370

(22) PCT Filed: Aug. 3, 2007

(86) PCT No.: PCT/JP2007/065266
§ 371 (c)(1),
(2), (4) Date: Feb. 4, 2009

(87) PCT Pub. No.: WO2008/016140
PCT Pub. Date: Feb. 7, 2008

(65) Prior Publication Data
US 2010/0159257 A1   Jun. 24, 2010

(30) Foreign Application Priority Data
Aug. 4, 2006   (JP) .................................. 2006-213117

(51) Int. Cl.
*B32B 15/04* (2006.01)
*C22C 12/00* (2006.01)

(52) U.S. Cl. ........ 428/457; 420/577; 420/555; 420/589; 148/23

(58) Field of Classification Search ............. 428/457; 420/577, 555, 589; 148/23
See application file for complete search history.

(56) References Cited

U.S. PATENT DOCUMENTS

| | | | |
|---|---|---|---|
| 5,520,752 A | 5/1996 | Lucey, Jr. et al. | |
| 6,184,475 B1 | 2/2001 | Kitajima et al. | |
| 6,915,944 B1 | 7/2005 | Takaya et al. | |
| 2001/0001990 A1 | 5/2001 | Kitajima et al. | |
| 2003/0047034 A1 | 3/2003 | Ono et al. | |
| 2003/0095888 A1 | 5/2003 | Kitajima et al. | |
| 2004/0052678 A1 | 3/2004 | Takesue et al. | |
| 2004/0065718 A1* | 4/2004 | Kubokawa et al. | ........ 228/180.1 |
| 2004/0184947 A1 | 9/2004 | Tanaka | |

(Continued)

FOREIGN PATENT DOCUMENTS
EP   0 629 465   12/1994
(Continued)

OTHER PUBLICATIONS

International Search Report issued Nov. 6, 2007 in the International (PCT) Application of which the present application is the U.S. National Stage.

(Continued)

*Primary Examiner* — Robert D. Harlan
(74) *Attorney, Agent, or Firm* — Wenderoth, Lind & Ponack, L.L.P.

(57) ABSTRACT

Disclosed is a solder material which enables to realize a lower mounting temperature when an electronic component is mounted. Also disclosed are a solder paste and a conductive adhesive. Specifically disclosed is a solder material having a basic composition composed of Sn, Bi and In. This solder material may further contain at least one metal selected from the group consisting of Cu, Ge and Ni. A solder paste which enables to realize a low-temperature mounting can be obtained by blending a flux component into the solder material. A conductive adhesive which enables to realize a low-temperature mounting can be obtained by blending a resin component into the solder material.

15 Claims, 3 Drawing Sheets

U.S. PATENT DOCUMENTS

| | | | |
|---|---|---|---|
| 2006/0067582 A1* | 3/2006 | Bi et al. | 382/233 |
| 2006/0067852 A1* | 3/2006 | Suh et al. | 420/555 |

FOREIGN PATENT DOCUMENTS

| | | |
|---|---|---|
| EP | 1 231 016 | 8/2002 |
| EP | 1 231 016 A1 * | 8/2002 |
| JP | 48-39694 | 11/1973 |
| JP | 7-1178 | 1/1995 |
| JP | 8-150493 | 6/1996 |
| JP | 8-224689 | 9/1996 |
| JP | 10-163605 | 6/1998 |
| JP | 11-33775 | 2/1999 |
| JP | 3027441 | 1/2000 |
| JP | 2000-141079 | 5/2000 |
| JP | 2000-511466 | 9/2000 |
| JP | 2001-170797 | 6/2001 |
| JP | 2003-13165 | 1/2003 |
| JP | 2003-166007 | 6/2003 |
| JP | 2004-111935 | 4/2004 |
| JP | 2004-160508 | 6/2004 |
| JP | 2004-190113 | 7/2004 |
| JP | 2006-199937 | 8/2006 |
| WO | 97/43081 | 11/1997 |

OTHER PUBLICATIONS

Supplementary European Search Report issued in Application No. EP 07 79 1939.

* cited by examiner

BONDING MATERIAL, BONDED PORTION AND CIRCUIT BOARD

This application is a U.S. National Stage of International Application No. PCT/JP2007/065266, filed Aug. 3, 2007.

FIELD OF THE INVENTION

The present invention relates to a bonding material to be used for mounting an electronic component on an electronic circuit board or forming an electronic wiring pattern on a circuit board.

DESCRIPTION OF THE RELATED ART

Heretofore, a Sn—Pb solder material, particularly a Sn—Pb eutectic solder material with a 63Sn-37Pb eutectic composition (composition of 63% by weight of Sn and 37% by weight of Pb) has conventionally been used as a bonding material for electronic component mounting.

Figure 1:
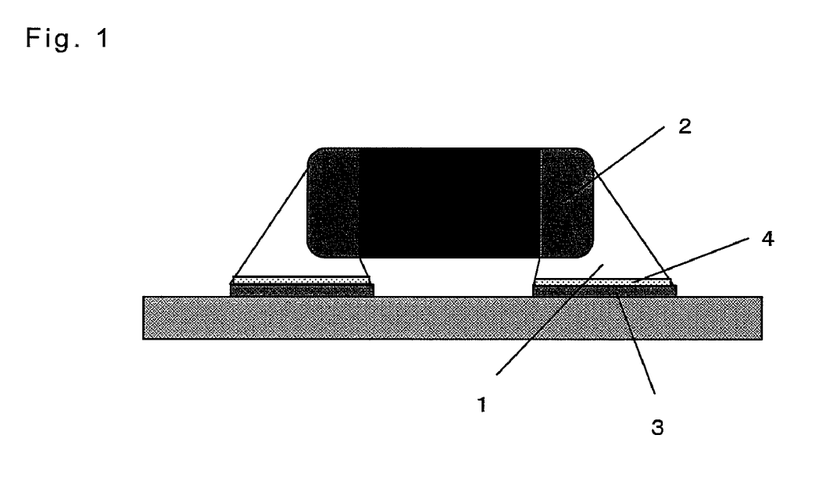
FIG. 1 shows a schematic view of a conventional bonding structure of an electronic component having electrodes.

FIG. 1 shows a schematic view of a bonding structure using a Sn—Pb solder material. In FIG. 1, an electronic component is mounted on an electronic circuit board by bonding electrodes of the electronic component 2 with lands of the circuit board 3 using a Sn—Pb solder material 1. The land 3 substantially made of Cu (copper). A layer of Cu—Sn compound 4 is formed at the bonding interface between the Sn—Pb solder material 1 and the land 3, thereby the electrodes of the electronic component 2 are mounted onto the electronic circuit board.

However, in electronic component mounting, there has recently been required an improvement in the mechanical strength of the soldering portion and an improvement reliability of a thermal shock strength.

While global environmental protection has become of major interest, regulation of treatment of industrial waste such as electronic circuit boards is becoming more severe and lead is becoming a global regulation subject.

Thus, in the bonding material, there is a tendency that the Sn—Pb solder material is replaced with a solder material containing no lead, so-called a lead-free solder material. Typical example of such a lead-free solder containing two kinds of metals as main components includes a Sn—Ag solder as a eutectic alloy material (Patent Documents 1 and 2).

Since the melting point of the Sn—Ag solder is about 30 to 40° C. higher than the melting point of the Sn—Pb solder (about 183° C.), the soldering temperature in the case of using the Sn—Ag solder is higher than that in the case of using the Sn—Pb solder. Therefore, when the Sn—Ag solder is used, the mounting temperature in the case of mounting electronic components may become higher than the heat-resistant temperature of electronic components. In this case, there arises a problem that electronic components may be damaged.

Then, a conductive adhesive having a curing temperature (or hardening temperature) which is relatively lower than the melting point of the lead-free solder material has attracted attention as an alternative to such lead-free solder in order to avoid or relieve such a thermal damage of the electronic components (Patent Document 3).

Patent Document 1: Japanese Patent No. 3,027,441
Patent Document 2: U.S. Pat. No. 5,520,752
Patent Document 3: Japanese Patent Publication No. 10-163605

DISCLOSURE OF THE INVENTION

Problems to be Solved

A general electrically conductive adhesive comprises a thermocurable resin component wherein a Ag filler is dispersed as a electroconductive filler. When an electronic component is bonded or an electronic wiring pattern is formed on a circuit board using such electrically conductive adhesive, the bonded portion or the wiring pattern tends to show dispersed values of volume resistivity. In addition, such a volume resistivity tends to increase rather than a bulk metal and Sn—Pb solder material.

Such dispersed values of volume resistivity and increased volume resistivity may be thought to be caused by the shape and orientation of the Ag filler particles, which form electroconductive paths within the hardened electrically conductive adhesive. In general, an Ag filler particle has a flake-like or rod-like form in a minute size. In a three-dimensional form of an Ag filler particle, given that its dimension having the longest size (hereinafter, referred to as the "maximum length") is called as its longitudinal direction (for example, the direction of Z-axis), any other direction which is perpendicular to the longitudinal direction (i.e. any direction within x-y plane which is perpendicular to the Z axis) has a size much shorter than the above maximum length, for example, 1% or less, 0.1% or less or 0.01% or less (hereinafter, referred to as the "minimum length"). That is, an Ag filler particle has a considerably large aspect ratio.

Figure 2:
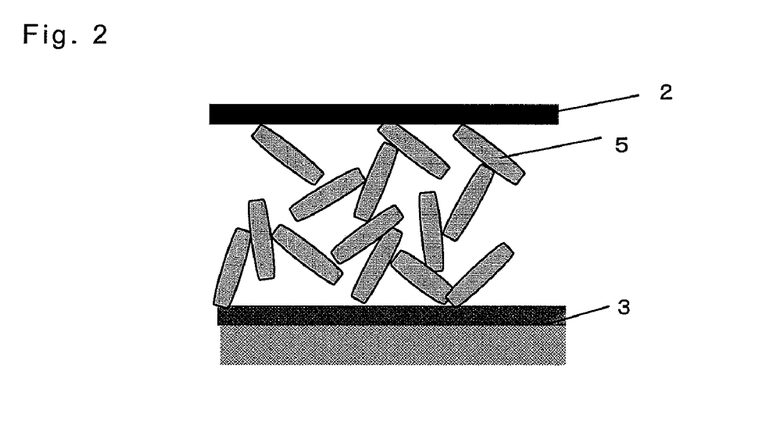
FIG. 2 shows a schematic section of the bonded portion of the conventional conductive adhesive containing Ag filler after being cured.

FIG. 2 shows a schematic section of the bonded portion between the electrodes of the electronic component 2 with the lands of the circuit board 3 using the conventional conductive adhesive by a microscopic observation. In the cured conductive adhesive, Ag filler particles are randomly dispersed. Thus, each longitudinal direction of each Ag filler particle randomly points to a optional direction among the three-dimensional relationship and the longitudinal directions of the Ag filler particles as a whole point to all directions in the three-dimensionally relationship. The electroconductive path between an electrode 2 and a land 3 is formed such that adjacent Ag filler particles contact each other and the contacted particles extends their contacting points further, thereby the contacted and agglomerated particles as a whole form a conductive cross-link between the electrode 2 and the land 3.

In this case, an Ag filler particle contacts with its adjacent particle by a point contact or a relatively small area contact, so that it is not easy to ensure a stable contact condition among the Ag filler particles. Accordingly, the electrical continuity among the Ag filler particles is not so good in comparison with the cases forming the bonded portion using Sn—Ag solder or a bulk metal.

When the ratio of the Ag filler particles among the particles of the electrically conductive adhesive which forms the bonded portion, which particles contribute less to forming the electroconductive path in the bonded portion, is increased, the volume resistivity of the bonded portion may become higher than those resistivity of the bulk metal and the Sn—Pb solder materials. Then, it is conceivable that the bonded portion or the wiring pattern tends to show dispersed values of volume resistivity and/or increased values of volume resistivity.

As mentioned above, since the electrically conductive adhesive had a tendency that the bonded portion or the wiring pattern formed thereby show dispersed values of volume resistivity and/or increased values of volume resistivity, so that the application of the electrically conductive adhesive was limited.

The present invention is directed to provide a bonding material and an electrically conductive adhesive, each of which can solve the above problems.

Means for Solving the Problems

According to a first aspect of the present invention, there is provided a solder material characterized by having a basic composition consisting of Sn, Bi and In. The present solder material can show a melting point of 120 degree C. or less, preferably 110 degree C. or less, particularly preferably 100 degree C. or less. Since the solder material contains no Ag, it can attain such a particularly low melting point.

According to a second aspect of the present invention, there is provided a solder paste containing a flux component in addition to the solder material having the basic composition consisting of Sn, Bi and In. Since the present solder paste contains the solder material having the melting point of 120 degree C. or less as mentioned above, the present solder paste can attain a bonding temperature of 120 degree C. or less.

According to a third aspect of the present invention, there is provided a conductive adhesive containing a flux component and a resin component in addition to the solder material having the basic composition consisting of Sn, Bi and In. Since the present conductive adhesive contains the solder material having the melting point of 100 degree C. or less as mentioned above, the present conductive adhesive can attain a bonding temperature of 120 degree C. or less. It is possible to adjust the bonding temperature of the present conductive adhesive 120 degree C. or less by selecting the resin component for the conductive adhesive.

In the above inventions, the solder material has a basic composition consisting of Sn, Bi and In. The basic composition was found to achieve a good balance between a high reliability and a low melting point after forming a bonded portion using the solder material containing both Bi and In in a particular ratio in addition to Sn, rather than using a solder material containing any one of Bi or In in addition to Sn. Accordingly, the present solder material attains improved properties of elongation and of lowered melting point as an alloyed solder material by having a basic composition of ternary metal system consisting of Sn, Bi and In.

When the solder material contains Bi in a particular ratio, the toughness of the alloy obtained after the solder material being cured can be specifically improved. When the toughness of the alloy improves, the toughness of the bonded portion made of the alloy also improves, thereby a bonded portion having a high reliability is resulted. Therefore, it is possible to achieve a good balance between a higher reliability and a lower melting point of the bonded portion by using the present solder material. As to the lower limit of the content of Bi, it is suitable that the content is 50% by weight or more, preferably 52% by weight or more, more preferably 55% by weight or more, further more preferably 58% by weight or more, particularly more preferably 58.5% by weight or more. As to the upper limit of the content of Bi, it is suitable that the content is 70% by weight or less, preferably 65% by weight or less, more preferably 55% by weight or less. The reason why the lower limit of Bi content is 50% by weight is as follows. When the Bi content is less than 50% by weight, such solder material fails to achieve a sufficient effect of lowering melting point. The reason why the upper limit of Bi content is 70% by weight is as follows. When the Bi content is above 70% by weight, such solder material fails to achieve a sufficient extent of improving property of elongation.

When the solder material contains In in a particular ratio, the toughness of the alloy obtained after the solder material being cured can be specifically improved. When the toughness of the alloy improves, the toughness of the bonded portion made of the alloy also improves, thereby a bonded portion having a high reliability is resulted. Therefore, it is possible to achieve a good balance between a higher reliability and a lower melting point of the bonded portion with using the present solder material. As to the lower limit of the content of In, it is suitable that the content is 10% by weight or more, preferably 15% by weight or more, more preferably 17.5% by weight or more. As to the upper limit of the content of In, it is suitable that the content is 25% by weight or less, preferably 24.5% by weight or less, more preferably 24% by weight or less. Optionally, the upper limit of In content can be adjusted to 15.5% by weight and the lower limit can be adjusted to a lower value than it, for example 10% by weight. The reason why the lower limit of In content is 10% by weight is as follows. When the In content is less than 10% by weight, such solder material fails to achieve a sufficient effect of lowering melting point. The reason why the upper limit of In content is 25% by weight is as follows. When the In content is above 25% by weight, such solder material fails to achieve a sufficient extent of improving property of elongation.

The inventors found the fact that the bonded portion prepared using the solder material containing both Bi and In in a particular ratio in addition to Sn successfully achieves a good balance between a higher reliability and a lower melting point rather than using a solder material containing any one of Bi or In in addition to Sn. Specifically, it is most suitable that the present solder material has a composition in a range defined by $$50.0 \leq [Bi] \leq 70.0$$

and $$10.0 \leq [In] \leq 24.5$$

with the balance [Sn] (that is, in the above range, [Bi] is greater than or equals to 50.0% by weight and [Bi] is smaller than or equals to 70.0% by weight and [In] is greater than or equals to 10.0% by weight and [In] is smaller than or equals to 24.5% by weight) and the balance of [Sn], given that each content of In, Bi and Sn is represented by [In], [Bi] and [Sn], respectively, which content is based on the weight of the basic composition consisting of Sn, Bi and In.

In one preferable embodiment of the present invention, each of the In content represented by [In] and the Bi content represented by [Bi] is focused. The preferred region for the present invention is found to reside in an area where a region (A) overlaps with a region (B) in X-Y orthogonal coordinates, wherein [Bi] is taken as X-axis and [In] is taken as Y-axis; the region (A) is defined by the range of $$50.0 \leq [Bi] \leq 70.0$$

and $$10.0 \leq [In] \leq 24.5$$

(that is, in the region (A), [Bi] is greater than or equals to 50.0% by weight and [Bi] is smaller than or equals to 70.0% by weight, and [In] is greater than or equals to 10.0% by weight and [In] is smaller than or equals to 24.5% by weight); the region (B) is defined by the formula (1):

$$5[Bi]+3[In] \geq 291 \qquad (1);$$

(that is, the region (B) is shown by the formula (1) where the term (5[Bi]+3[In]) is greater than or equals to the value 291); and
the balance is [Sn].

Figure 5:
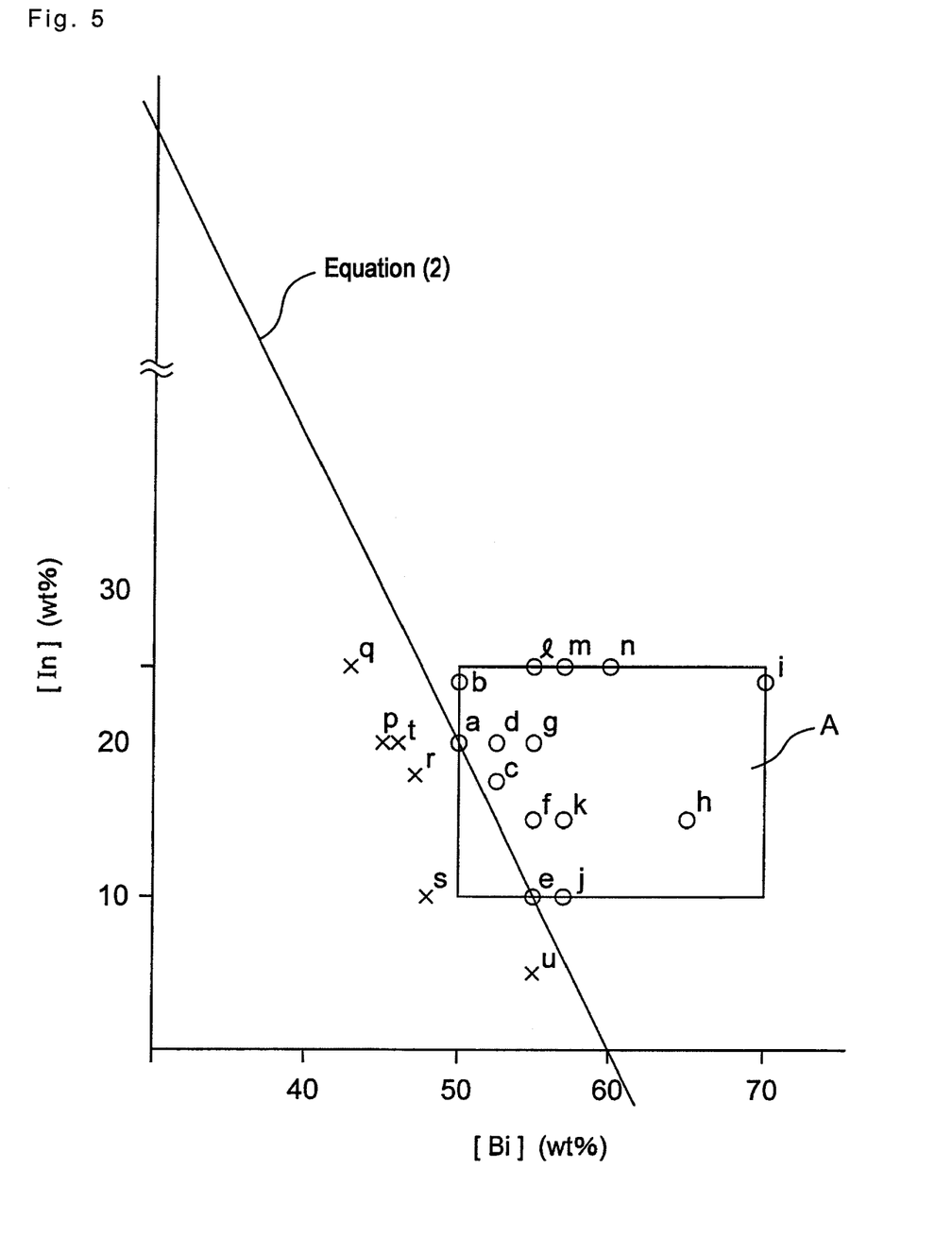
FIG. 5 shows a graph showing the compositions of the conductive adhesive of the working examples and the comparative examples in the present invention, wherein [In] is taken as the Y-axis, [Bi] is taken as X-axis and [In] is plotted as a function of [Bi].

A graph which shows the above way of thinking is shown in FIG. 5.

In FIG. 5, the quadrangular region corresponds to the above region (A). The straight line therein is represented by the following formula (2):

$$5[Bi]+3[In]=291 \qquad (2).$$

The formula (2) was obtained by the experiments as explained in the following.

The inventors also found the fact that Examples wherein [In] and [Bi] reside in the upper right region of the straight line represented by the formula (2) (working examples of the present invention) show more suitable properties rather than Examples wherein [In] and [Bi] reside in the lower left region of the straight line represented by the formula (2) (comparative examples of the present invention). Accordingly, it may be expressed that, in the graph shown in FIG. 5, the preferable region for both [In] and [Bi] in the present invention resides in the region where the region (A) surrounded by the rectangular frame overlaps with the region (B) represented by the formula (1):

$$5[Bi]+3[In] \geqq 291 \qquad (1);$$

in one embodiment of the present invention.

In a case where the present solder material contains the ternary metal system consisting of Sn, Bi and In as mentioned above, it should be noted that after each content of Bi and In is specified to a particular value, respectively, the balance substantially corresponds to the content of Sn. In this case, the reason why the term "substantially" is used is that each of the practical materials for the solder material may contain a certain level of impurities, so that it is possible that the sum of the contents of the three components do not equal to 100%.

The present solder material may further contain at least one metal selected from the group consisting of Cu, Ge and Ni in addition to the above basic composition. Cu, Ge and Ni are added for the purpose of improving mechanical properties of the alloy.

The content of Cu in the solder material is preferably within a range from 0.1 to 1.0% by weight, and more preferably from 0.5 to 0.7% by weight. The reason why Cu content in the solder material is limited to the range from 0.1 to 1.0% by weight is as follows. When Cu content is less than 0.1% by weight, such solder material fails to show a significant effect in its mechanical property. When Cu content is above 1.0% by weight, the alloy tends to show embrittlement behavior, which is not preferable for the mechanical property.

The content of Ge in the solder material is preferably within a range from 0.001 to 0.1% by weight, and more preferably from 0.001 to 0.01% by weight. The reason why Ge content in the solder material is limited to the range from 0.001 to 0.1% by weight is as follows. When Ge content is less than 0.001% by weight, such solder material fails to show a significant effect in its mechanical property. When Cu content is above 0.1% by weight, the melting point of the alloy tends to rapidly increase.

Ni is added to the solder material for the purpose of suppressing oxidation of Sn. The content of Ni in the solder material is preferably within a range from 0.001 to 0.1% by weight, and preferably equal to 0.005% by weight or more, and more preferably equal to 0.001% by weight or more. The Ni content is preferably equals to 0.05% by weight or more and preferably 0.1% by weight or less. The reason why Ni content in the solder material is limited to the range from 0.001 to 0.1% by weight is as follows. When Ni content is less than 0.01% by weight, such solder material fails to show a significant effect in its Sn-oxidation suppressing property. When Ni content is above 0.1% by weight, the melting point of the alloy increases due to forming Ni oxidation film, so that it fails to show a significant effect in its Sn-oxidation suppressing property.

In the solder material, any one selected from various kinds of particular forms may be used. For example, the forms may be granular form or massive form having nearly equal length in each of three-dimension, plate-like form or disc-like form having large lengths in two-dimensions rather than the other remaining dimension, and rod-like form or needle-like form or linear form having a large length in one dimension rather than the other remaining two dimensions. The solder materials having such various forms of the particles are used in the solder compositions or conductive adhesive compositions by being dispersed therein. The average particle size of the solder material is from 5 to 30 micro meter.

In the present second and the third inventions, it is possible to use rosins or modified rosins such as specified in JIS Z 3283 as its major component, which further contains haloid salt of amine, organic acid or amine organic acid salt as an activator component as needed. The flux component may contain alcohols having C2 to C3 carbon atoms as its solvent. The ratio of the solder material and the flux component in the solder paste may be suitably selected based on the application of the solder paste, composition of the solder material and the kinds of the flux components. In general, the ratio of the solder material is preferably from 85 to 95% by weight, in particular from 88 to 93% by weight based on the solder paste as a whole. When the content of the solder material is less than 85% by weight, the wettability of the solder material get worse and the bonding reliability would be decreased. When the content of the solder material is above 95% by weight, dispersion thereof in the flux components comes to be decreased.

In the present third invention, it is possible to use any of various kinds of curable resin known to those skilled in the art, for example, thermocurable resins, photocurable resins, resins that begin to cure upon being subjected to radiations having various wavelength. Since the solder material should be fused, the thermocurable resins are preferable. In the present invention, epoxy resins, acrylic resins, phenol resins, polyimide resins, thermocurable polyurethane resins, unsaturated polyester resins and the like can be used as the thermocurable resins, and the epoxy resins are desirable. As the epoxy resin, various kinds of epoxy resins from a single-liquid type or two-liquid type can be used, and a single-liquid type epoxy resin is preferable. When the resin component used in the first invention is curable resin, a curable resin system (which system contains a particular curable resin and its corresponding curing agent(s) which is necessary for curing the resin) is added to the resin component.

The weight ratio of the solder material to the total weight of the conductive adhesive compositions can be appropriately selected by adapting the application of the conductive adhesive, the kinds of the solder material and the resin components. It is preferable that the content of the solder material is from 70 to 90% by weight, in particular from 80 to 85% by weight based on the total weight of the conductive adhesive compositions. When the content of the solder material is less than 70% by weight, a sufficient conductivity may not be obtained after cured. When the content of the solder material is above 90% by weight, it is conceivable that the conductive path will not be sufficiently surrounded by the cured resin after cured.

In the case where the conductive adhesive based on the present third invention is used for mounting an electronic component on an electronic circuit board or forming an electronic wiring pattern on a circuit board, the solder material does not contain a metallic material such as an Ag filler particle which does not melt at the mounting temperature. Thus, it is possible to substantially prevent the dispersion of the values of volume resistivity in the bonded portion according to the present third invention, which dispersion is caused by the sizes (or dimensions), forms and the orientation of the metallic filler particles.

In addition, the alloy, which is obtained after the solder material melted (or fused), shows a melting point less than those of the conventional lead-free solder and Sn—Pb solder material, so that a lower mounting temperature can be attained.

Figure 3:
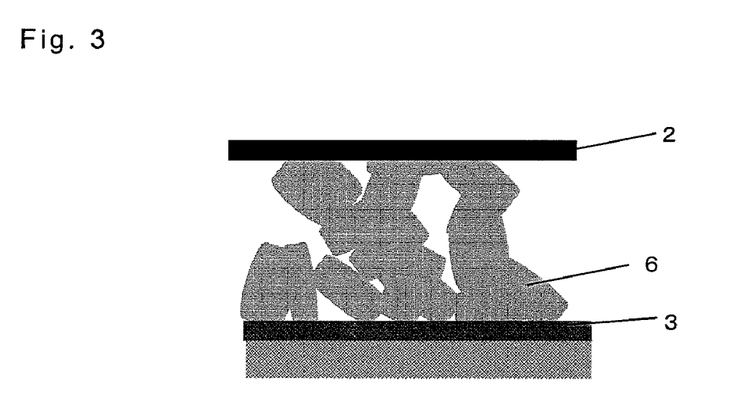
FIG. 3 shows a schematic section of the bonded portion of the present conductive adhesive after being cured.

FIG. 3 shows a schematic section of the bonded portion between the electrodes 2 of the electronic component with the lands 3 of the circuit board using the present conductive adhesive according to the third invention. In the cured conductive adhesive, the solder material does not remain its original particle form. In the bonding portion, the solder material forms a conductive path connecting the electrode 2 and the land 3 therebetween, for example, by randomly heaping block-like masses from the land 3 toward the electrode 2 until reaching the electrode 2. This conductive path has been produced by the process as mentioned hereinafter. The particles of the solder material dispersed in the resin were molten and liquefied by being subjected to a heat treatment, each of the liquefied solder materials coalesced together and made contact with each other to form a flow path, and then the solder materials solidified with keeping the form of the liquid communication flow path. Thus, it is conceivable that a three-dimensional network between the electrode 2 and the land 3 based on the form of the liquid communication flow path. The conductive path is not formed by the heaped block-like masses wherein each mass contacts with adjacent mass by point contact or small area contact, but formed by a three-dimensionally elongated network between the electrode 2 and the land 3 based on the form of the liquid communication flow path which is produced by the liquefied solder materials. Accordingly, a plurality of conductive paths have been produced between the electrode 2 and the land 3, which conductive paths are made of a highly filled solder material.

According to the present invention, the conductive adhesive comprises metals having relatively low melting points, so that the solder material itself is possible to melt at a relatively low temperature range in the step of heating and curing of the conductive adhesive. The present conductive adhesive can electrically connect the land 3 with the electrode 2 with a metallic bonding or a bonding similar to a metallic junction, which bonding or junction has been produced as follow. After the present conductive adhesive being applied to the space between the land 3 and the electrode 2 in a suitable amount is heated, each particle of the solder material dispersed in the resin come to coalesce together in the resin, as shown in FIG. 3 for example, thereby a liquid communication flow path is formed. Then after cured, the solder material forms at least one mass of the metal (i.e. an ingot), and the conductive path made of the metal component in the resin may be obtained. Since the conductive path connecting the land 3 and the electrode 2 is made of the ingot substantially having no break, the present invention can provide stable and low volume resistivity as a bulk metal when the conductive adhesive of the present invention is used.

In a case where an electronic wiring pattern is formed on a circuit board using the conductive adhesive of the present invention, the electrode 2 shown in FIG. 3 is not present. However, when the present conductive adhesive (in a state before curing) is applied on to a surface of a circuit board in a particular pattern, heated and cured, thereby the solder material in the molten condition coalesce together in the resin and make contact with each other to form a flow path according to the shape (geometric configuration) of the wiring pattern on the circuit board. Accordingly, also in this case, the present invention can provide stable and low volume resistivity as a bulk metal when the conductive adhesive of the present invention is used.

The present invention further provides an invention of a conductive adhesive containing the resin component, which resin component contains curable resin as a first component and a resin having reducing property as a second component. In an embodiment of the present conductive adhesive, the resin component is the resin having reducing property. In an optional embodiment of the present conductive adhesive, the resin component is a sole resin having reducing property. As the curable resin and the solder material, those mentioned in the above first embodiment of the present invention may be used.

For example in a case where an electronic component is mounted using a conventional conductive adhesive, when the metallic component of the solder material in the conductive adhesive is heated, it may occasionally happen that the surface of the metallic component of the solder particles are oxidized before the solder particles melt (or fuse), thereby the surface of the solder particles are covered with an oxide film. The oxide film formed on the surface of the solder particles may act as a protective film, which hinders the melting of solder particles. Thus, the oxide film may prevent the solder material from melting at a particular temperature in the step of heating and curing of the conductive adhesive. As a result, solder particles which could not sufficiently melt in the step of heating and curing may remain after such step.

When the present conductive adhesive is used in the above case, the resin component having reducing property contained in the conductive adhesive may maintain somewhat a reductive atmosphere. Thus, it is possible to substantially prevent an oxide film from forming on the surface of the solder particle during the heating and curing step. Thus, the oxidation of the surface of the solder particles may be prevented in the heating and curing step, and insufficient melting of the solder material in the heating and curing step may be prevented.

In one aspect, the resin having reducing property preferably contains a compound having a carboxyl group, for example, carboxylic acid. By adding such a compound in the resin, it is possible to remove an oxide film of a low melting point metal (to prevent formation of an oxide film on the surface of a low melting point metal) and to exert an action as a reducing agent for promoting melting. As such compound, various carboxylic acids such as an aliphatic carboxylic acid, an aromatic carboxylic acid and an alicyclic carboxylic acid can be used. Examples of such compounds include adipic acid, abietic acid, ascorbic acid, acrylic acid, citric acid, polyacrylic acid, malic acid, pimelic acid, palmitic acid, myristic acid, lauric acid, sebacic acid, suberic acid, maleic acid, succinic acid, azelaic acid, fumaric acid, glutaric acid and malonic acid. The carboxylic acid is preferably in the form of a salt of metals such as Na, Ag, Cu and K.

In another aspect, there is a case where the resin contains an organic compound containing a metal as a third resin component is preferable. At normal temperature, the metal stably forms bond with or combines with an organic compound. When the compound is heated, the metal can be liberated or detached from the organic compound, so that the liberated metal accelerates the curing reaction of the resin. As a result, the resin can act as a curing agent wherein rapid (or short time) curing is compatible with preservation stability. It is preferable that such a metal is at least one metal selected from the group of Na, Ag, Cu and K.

In still another aspect, it is preferable that the organic compound containing the metal further contain a carboxyl group or an amino group. In such case, the resin can synergistically act as a reducing agent due to the carboxyl group or the amino group and also act as the curing agent due to the organic compound containing the metal in the step or heating and curing. Thus, the resin can perform a suitable action of the reducing agent.

In the third invention, the ratio of the weight of the solder material to the total weight of the conductive adhesive may be the same as that of the second invention. In the resin component, the ratio of the first resin component to the second resin component is in a range from 90:10 to 10:90, preferably in a range from 50:50 to 80:20 based on weight. The content ratio of the resin component to the solder material is preferably 20% by weight or less. When the content of the resin component is over 20% by weight, no further contribution in the action as the reducing and/or curing agent is observed. The content of the resin component is preferably equals to 10% by weight or less in order to show the above action. In a case where the second resin component acts as the curing agent, it is possible to reduce the amount of the curing agent, which is to be used in the first resin component.

Effect of the Invention

The first invention relating to the present solder material can show a low melting point of 120 degree C. or less by adopting a solder material having a basic composition consisting of Sn, Bi and In. Further, the present solder material can show a significant elongation in a range of at least 80% or more, preferably 85% or more, more preferably 90% or more, particularly preferably 95% or more. Using the present solder material, the bonding temperature, i.e. the mounting temperature substantially equals to 120 degree C. or less may be achieved. In addition, after cured, the solder material may form a bonded portion, which portion has high reliability and high tolerance to stress.

The second invention relating to the present solder paste can achieve the bonding temperature, i.e. the mounting temperature of 120 degree C. or less, since it comprises a flux component in addition to the solder material of the first invention. After cured, the solder paste forms a bonded portion having high reliability and high tolerance to stress, since the cured solder material shows a significant elongation.

The third invention relating to the present conductive adhesive can achieve the bonding temperature of 120 degree C. or less and the curing temperature, i.e. the mounting temperature of 120 degree C. or less, since it comprises a suitable resin component in addition to the solder material of the first invention. After cured, the conductive adhesive forms a bonded portion having high reliability and high tolerance to stress, since the cured solder material shows a significant elongation.

Since the solder material cures after it is sufficiently molten or fused in the heating step, it can produce a conductive path made of an ingot of the metal of the solder material substantially having no break. Accordingly, the bonded portion made of the present solder material, including the solder paste and the conductive adhesive, can achieve stable and low volume resistivity as the bulk metal.

The present conductive adhesive can effectively prevents insufficient melting of the metal due to the oxidation of the metal, which has a low melting point, in the heating and curing step by adding a resin having reducing property or a curing agent (the second resin component) to the conductive adhesive. Further, the present conductive adhesive can be used at a relatively low mounting temperature, since the alloy having a low melting point can be sufficiently molten at its own melting point.

EXPLANATION OF THE TERMS

1: Sn—Pb solder,
2: electrode of an electronic component,
3: land of an electronic circuit board,
4: layer of CuSn-compound,
5: Ag filler,
6: solder after being molten and cured.

Suitable embodiments to carry out the present invention
(First Embodiment)

In a first embodiment of the present invention, the melting point and the elongation of the solder materials having the compositions corresponding to each of Examples 1-20 and Comparative Examples 1-6 as shown in Table 1.

The melting point was measured by using a differential scanning calorimeter (DSC).

The elongation was measured according to JIS Z 2241 (Method of Tension Test for Metallic Materials). The values of elongation (%) were the breaking elongation (%) measured according to JIS Z 2241.

Using each composition of the solder materials corresponding to each of Examples, each solder paste was formed. In the solder material, metallic micro fine particles having powder form or flake form, which is commercially available, may be used. A solder paste containing a solder component, containing 90% by weight of solder material and 10% by weight of flux (rosin based flux), is prepared.

(Measurement of the Repeated Bending Strength Test)

Figure 4:
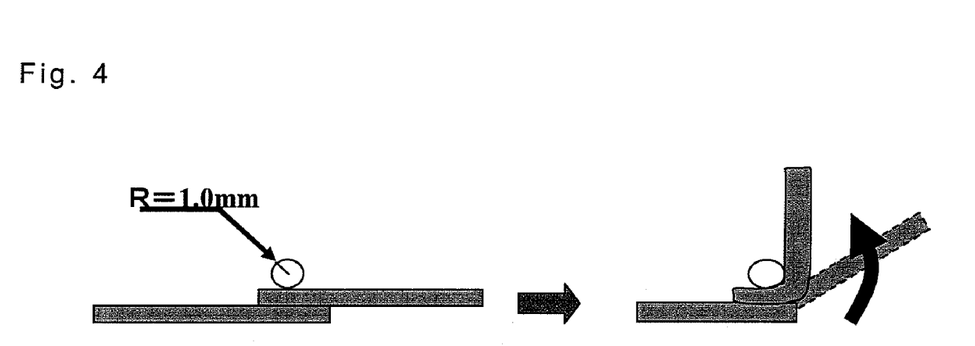
FIG. 4 shows an explanatory drawing to show a repeated bending strength test.

The repeated bending strength was measured according to the method as follows. As shown in FIG. 4 left, two pieces of flexible boards (having thickness 0.08 mm, length 30 mm, width 20 mm), each of which board having corresponding contact point, wherein an overlapping width (or overlapping length) of each flexible board being settled as 5 mm, was prepared. The present solder paste was printed at a contact point of one board in a suitable quantity. On the board, another board was placed in face-to-face relationship, so that two contact points opposed each other and the overlapping two pieces of boards were subjected to a heat treatment according to a heat process, wherein a soldering peak temperature was set at a temperature which was 10 degree C. above the melting point of the solder particle with retaining a temperature over the melting point for at least 20 seconds, thereby the two pieces of flexible boards were bonded each other.

Thereafter, a stainless rod having a radius (R) of 1.0 mm was placed on the bonded portion of the two pieces of flexible boards with holding the rod by pressing downwardly, a free end of the upper board was bent as shown in FIG. 4. From the original position wherein the upper board extended horizontal direction, which direction corresponds to the extension of the lower board (FIG. 4 left) (i.e. the horizontal position), the upper board was bent at about right angle around a fulcrum of the stainless rod (FIG. 4 right) (i.e. the upward position) and elongated again to the original horizontal position. One reciprocating movement (i.e. bending to the upward position and returned to the horizontal position) was counted as one cycle.

The reciprocating movement was continued until any break forms at the bonded portion. The number of the counted cycles until the break was observed at the bonded portion was shown in Table 1 in each of Examples. In addition, each elongation value of the solder materials was measured.

and having a composition wherein the elongation of the alloy is improved, the problems relating to the mechanical strength could have been remarkably improved. Thus, a bonded portion having high mechanical strength and high reliability could be provided by the present invention.

TABLE 1

Solder compositions and bonding properties
(solder:flux = 90:10 (% by weight))

|  | point | Sn | Bi | In | Cu | Ni | Ge | melting point (degree C.) | elongation (%) | repeated Bending Strength (cycles) |
|---|---|---|---|---|---|---|---|---|---|---|
| Example 1 | a | 30 | 50 | 20 | — | — | — | 105 | 210 | 2800 |
| Example 2 | b | 26 | 50 | 24 | — | — | — | 98 | 220 | 2900 |
| Example 3 | c | 30 | 52.5 | 17.5 | — | — | — | 103 | 200 | 2600 |
| Example 4 | d | 27.5 | 52.5 | 20 | — | — | — | 98 | 190 | 2500 |
| Example 5 | e | 35 | 55 | 10 | — | — | — | 110 | 90 | 1500 |
| Example 6 | f | 27.5 | 55 | 17.5 | — | — | — | 100 | 180 | 2400 |
| Example 7 | g | 25 | 55 | 20 | — | — | — | 96 | 130 | 2000 |
| Example 8 | h | 20 | 65 | 15 | — | — | — | 99 | 85 | 1300 |
| Example 9 | i | 6 | 70 | 24 | — | — | — | 70 | 80 | 1200 |
| Example 10 | j | 33 | 57 | 10 | — | — | — | 115 | 90 | 1500 |
| Example 11 | k | 28 | 57 | 15 | — | — | — | 105 | 100 | 1800 |
| Example 12 | l | 20 | 55 | 25 | — | — | — | 85 | 100 | 1700 |
| Example 13 | m | 18 | 57 | 25 | — | — | — | 80 | 90 | 1600 |
| Example 14 | n | 15 | 60 | 25 | — | — | — | 79 | 80 | 1500 |
| Example 15 |  | 32.5 | 57 | 10 | 0.5 | — | — | 120 | 88 | 1500 |
| Example 16 |  | 32.99 | 57 | 10 | — | 0.01 | — | 119 | 85 | 1600 |
| Example 17 |  | 32.99 | 57 | 10 | — | — | 0.01 | 119 | 90 | 1600 |
| Example 18 |  | 24.5 | 55 | 20 | 0.5 | — | — | 97 | 125 | 2000 |
| Example 19 |  | 24.99 | 55 | 20 | — | 0.01 | — | 96 | 127 | 2200 |
| Example 20 |  | 24.99 | 55 | 20 | — | — | 0.01 | 96 | 130 | 2300 |
| Comparative Example 1 | p | 35 | 45 | 20 | — | — | — | 122 | 120 | 1800 |
| Comparative Example 2 | q | 32 | 43 | 25 | — | — | — | 121 | 90 | 1300 |
| Comparative Example 3 | r | 35 | 47 | 18 | — | — | — | 124 | 180 | 2200 |
| Comparative Example 4 | s | 42 | 48 | 10 | — | — | — | 130 | 90 | 1200 |
| Comparative Example 5 | t | 34 | 46 | 20 | — | — | — | 122 | 200 | 2500 |
| Comparative Example 6 | u | 40 | 55 | 5 | — | — | — | 130 | 70 | 900 |

As Table 1 shows, the repeated bending strength was improved in the compositions where Bi and Sn were added to Sn rather than the conventional compositions containing Sn—Bi or Sn—In. Addition of any of Cu, Ge and Ni somewhat reduced the melting point and improves the mechanical strength.

The reason why the repeated bending strength is improved in Examples is that the elongation of the resulted alloy has been significantly improved by the present invention. This phenomenon is referred to as super plasticity. The alloys having low melting point, which do not show such super plasticity, tend to have relatively low mechanical strength, and such low mechanical strength was a problem to be solved. For practical use, improvement of the mechanical strength has been required. In case an alloy having a low melting point In FIG. 5, each of the points a-n, which corresponds to each of Examples 1-14 as shown in the above Table 1 (showing each letter a-n in the second column therein) is marked by each white circle a-n. Similarly, each of the points p-u, which corresponds to each of Comparative Examples 1-6 as shown in the above Table 1 (showing each letter p-u in the second column therein) is marked by each of X marks p-u. Each of the compositions marked by the circles has achieved the both properties of an elongation of at least 80% or more and a low melting point of 120 degree C. or less after being cured. To the contrary, each of the compositions marked by X could achieve either property of the elongation or the low melting point or failed to achieve both properties of the elongation and the low melting point. As to Examples 15-20, they are not shown in FIG. 5, since they contain a forth component other than the basic composition. Each of circles a-n resides in the region (A) surrounded by the rectangular frame in FIG. 5, which rectangular frame is surrounded by the area of $$50.0 \leq [Bi] \leq 70.0$$

and $$10.0 \leq [In] \leq 24.5$$

and each of Xs p-u does not reside in the region (A).

The inventors have found that the solder material of the present invention having the ternary metal system consisting of Sn, Bi and In is suitable when it contains both Bi and In in a particular ratio; the group of points p-u is considered to be aligned on a straight line having a particular slope in FIG. 5; and the group of points a-f and j is also considered to be aligned on a straight line having another particular slope in FIG. 5. That is, in the ternary metal system consisting of Sn, Bi and In, it is interpreted that the sum of [Bi] and [In] is preferably should not fall below a particular value, or should be greater than or equal to a particular value. The above formula (1) has been obtained based on the above concept.

In case where the group of points p-u is considered to be aligned on a straight line having a particular slope in FIG. 5, a formula:

$$5[Bi]+3[In]=286.5 \quad (3)$$

has been obtained as the formula of the straight line according to least-square method. Accordingly, it is possible that the Bi content [Bi] and the In content [In] in the basic composition, both of which being suitable for the solder material of the present invention, resides in an area, which area does not overlap the above line (3), and such area may be represented by the formula:

$$5[Bi]+3[In]>286.5 \quad (4)$$

The area where the region (A) overlaps with the region represented by the above formula (1) is contained in the area represented by a formula (4). The formula of the straight line which passes two points a and e is represented by the formula:

$$2[Bi]+[In]=120 \quad (5)$$

Thus, the basic composition of the solder material of the present invention may be said to reside at least in the area where the region represented by the formula:

$$2[Bi]+[In] \geq 120 \quad (6)$$

(that is, the term (2[Bi]+[In]) is greater than or equals to the value 120)
overlaps with the above region (A)

(Second Embodiment)

In a second embodiment of the present invention, each conductive adhesive using each solder material of Examples 1-20 and Comparative Examples 1-6 in the above first embodiment is prepared. As Comparative Example 7, a conductive adhesive containing merely Ag as its metallic component is prepared.

In each of Examples and Comparative Examples, a thermocurable epoxy resin is used as the resin component. In these Examples, any of Epicoat 828 and Epicoat 807 (manufactured by Japan Epoxy Resin (JER) Co., Ltd.) was used as a preferable Example of the epoxy resin and 2PHZ (manufactured by SHIKOKU CHEMICALS CORPORATION) was used as a hardening agent. In the solder material, commercially available metallic micro fine powder having flake form or powder form may be used. In each Example, the solder paste prepared in the first embodiment was used.

A conductive adhesive was prepared by adding 15% by weight of the above resin component to 85% by weight of solder component.

(Measurement of Volume Resistivity of Conductive Adhesive)

Each conductive adhesive composition corresponding to each Example was introduced into a mould having a rectangular parallelepiped form. Then the mould was heated in a heating chamber, which chamber was maintained at a temperature of 150 degree C. for five minutes, thereby the conductive adhesive composition was cured, and then the mould was cooled to a room temperature to obtain a sample. Thereafter, the volume resistivity of the cured conductive adhesive was measured. The measured value of the volume resistivity (rho ($\rho$)) of each sample was calculated based on the formula:

$$\rho = R \cdot L/S$$

[wherein R is the resistance value of the sample, L is the length and S is the cross-section of the rectangular parallelepiped form]
after each of R, L and S was measured.

(Measurement of Repeated Bending Strength)

Repeated bending strength was measures in a method the same as that of solder paste. As Table 2 shows, the volume resistivity of the conductive adhesive has been relatively largely decreased in the case where both Bi and In were added to Sn rather than the case where merely Ag is used, which volume resistivity was in the same level as that of solder alloy, In Examples to which Cu or Ge was added, the repeated bending strength was improved. In Examples where Ni was added, the melting temperature somewhat increased and the mechanical strength was improved.

TABLE 2 solder compositions and properties of the conductive adhesive

|  | Sn | Bi | In | Cu | Ni | Ge | Ag | melting point (degree C.) | volume resistivity (micro ohm cm) | repeated Bending Strength (cycles) |
| --- | --- | --- | --- | --- | --- | --- | --- | --- | --- | --- |
| Example 1 | 30 | 50 | 20 | — | — | — | — | 105 | 16.3 | 2800 |
| Example 2 | 26 | 50 | 24 | — | — | — | — | 98 | 15.9 | 2900 |
| Example 3 | 30 | 52.5 | 17.5 | — | — | — | — | 103 | 16.1 | 2600 |
| Example 4 | 27.5 | 52.5 | 20 | — | — | — | — | 98 | 16.0 | 2500 |
| Example 5 | 35 | 55 | 10 | — | — | — | — | 110 | 16.5 | 1500 |
| Example 6 | 27.5 | 55 | 17.5 | — | — | — | — | 100 | 16.0 | 2400 |
| Example 7 | 25 | 55 | 20 | — | — | — | — | 96 | 15.8 | 2000 |
| Example 8 | 20 | 65 | 15 | — | — | — | — | 99 | 16.0 | 1300 |
| Example 9 | 6 | 70 | 24 | — | — | — | — | 70 | 15.3 | 1200 |
| Example 10 | 33 | 57 | 10 | — | — | — | — | 115 | 16.7 | 1500 |

TABLE 2-continued solder compositions and properties of the conductive adhesive

| | Sn | Bi | In | Cu | Ni | Ge | Ag | melting point (degree C.) | volume resistivity (micro ohm cm) | repeated Bending Strength (cycles) |
|---|---|---|---|---|---|---|---|---|---|---|
| Example 11 | 28 | 57 | 15 | — | — | — | — | 105 | 16.5 | 1800 |
| Example 12 | 20 | 55 | 25 | — | — | — | — | 85 | 16.3 | 1700 |
| Example 13 | 18 | 57 | 25 | — | — | — | — | 80 | 16.5 | 1600 |
| Example 14 | 15 | 60 | 25 | — | — | — | — | 79 | 16.7 | 1500 |
| Example 15 | 32.5 | 57 | 10 | 0.5 | — | — | — | 120 | 16.1 | 1500 |
| Example 16 | 32.99 | 57 | 10 | — | 0.01 | — | — | 119 | 16.1 | 1600 |
| Example 17 | 32.99 | 57 | 10 | — | — | 0.01 | — | 119 | 16.0 | 1600 |
| Example 18 | 24.5 | 55 | 20 | 0.5 | — | — | — | 97 | 15.9 | 2000 |
| Example 19 | 24.99 | 55 | 20 | — | 0.01 | — | — | 96 | 15.8 | 2200 |
| Example 20 | 24.99 | 55 | 20 | — | — | 0.01 | — | 96 | 15.8 | 2300 |
| Comparative Example 1 | 35 | 45 | 20 | — | — | — | — | 122 | 16.9 | 1800 |
| Comparative Example 2 | 32 | 43 | 25 | — | — | — | — | 121 | 16.9 | 1300 |
| Comparative Example 3 | 35 | 47 | 18 | — | — | — | — | 124 | 17.0 | 2200 |
| Comparative Example 4 | 42 | 48 | 10 | — | — | — | — | 130 | 17.1 | 1200 |
| Comparative Example 5 | 34 | 46 | 20 | — | — | — | — | 122 | 16.8 | 2500 |
| Comparative Example 6 | 40 | 55 | 5 | — | — | — | — | 130 | 17.2 | 900 |
| Comparative Example 7 | — | — | — | — | — | — | 100 | 960 | 1.6 | 900 |

(Third Embodiment)

In a third embodiment of the present invention, a second resin component having reducing property as shown in Examples 21-25 in Table 3 was added to each of the solder paste prepared in Example 1. The weight ratio of the resin component to the solder material was 15:85 and the weight ratio of the first resin component to the second resin component was 80:20.

It was found that each alloy filler containing Sn and using any of adipic acid, abietic acid, ascorbic acid, acrylic acid, citric acid and polyacrylic acid as the second resin component showed improved fusibility and decreased volume resistivity. When each filler being after cured was observed, it was confirmed that Sn containing fillers were sufficiently fused (or molten), thereby metallic bond and the like was formed.

TABLE 3

| | reducing agent | volume resistivity (micro ohm cm) |
|---|---|---|
| Example 21 | adipic acid | 16.5 |
| Example 22 | abietic acid | 16.4 |
| Example 23 | ascorbic acid | 16.4 |
| Example 24 | citric acid | 16.3 |
| Example 25 | polyacrylic acid | 16.3 |
| Comparative Example 8 | unused | 16.7 |

INDUSTRIAL APPLICABILITY

The present conductive adhesive is useful for the applications for bonding an electronic component and forming an electronic wiring pattern.

The present conductive adhesive can be used for the application for mounting electronic components at a curing temperature relatively lower than the melting point of lead-free solder and also shows a volume resistivity which is stable and is comparable to the bulk metal. Accordingly, the present conductive adhesive is particularly effective in the mounting application of electronic components, which components have relatively low heatproof temperatures, while avoiding or suppressing to a minimum extent the electronic components being thermally damaged.

Further, the electrically conductive adhesive of the present invention can be used for mounting of electronic components on a circuit board being used in the electronic components such as CCD elements, holographic elements and chip components, and for forming the wiring of substrate to which those electronic components are bonded. The electronic components and substrate thus formed can be used in various electric appliances such as DVDs, cellular phones, portable AV equipment, laptop PCs and digital cameras.

The invention claimed is:
1. A solder material comprising,
   a basic composition consisting of Sn, Bi and In, wherein Bi content is in a range from 65 to 70% by weight, In content is in a range from 10 to 24.5% by weight and the balance is Sn.

2. A conductive adhesive containing a solder material comprising,
   a basic composition consisting of Sn, Bi and In, wherein Bi content is in a range from 65 to 70% by weight, In content is in a range from 10 to 24.5% by weight and the balance is Sn.

3. The conductive adhesive according to claim 2 further containing a flux component and a resin component.

4. The conductive adhesive according to claim 2 further comprising a curable resin.

5. The conductive adhesive according to claim 2 further comprising a resin having reducing property.

6. The conductive adhesive according to claim 5 wherein the resin having reducing property has a carboxyl group.

7. A circuit board comprising at least one bonded portion, wherein the bonded portion comprises a solder material comprising,
   a basic composition consisting of Sn, Bi and In, wherein Bi content is in a range from 65 to 70% by weight, In content is in a range from 10 to 24.5% by weight and the balance is Sn.

8. The circuit board according to claim 7 wherein the bonded portion comprises,
   a conductive adhesive containing a solder material comprising a basic composition consisting of Sn, Bi and In, wherein Bi content is in a range from 65 to 70% by weight, In content is in a range from 10 to 24.5% by weight and the balance is Sn,
   a flux component, and
   a resin component.

9. The circuit board according to claim 7 wherein the bonded portion comprises a conductive adhesive containing a flux component and a resin component.

10. The solder material according to claim 1, further comprising at least one metal selected from the group consisting of 0.001 to 0.1 parts of Ge and 0.001 to 0.1 parts of Ni based on 100 parts of the basic composition.

11. The solder material according to claim 1, further comprising 0.001 to 0.1 parts of Ge based on 100 parts of the basic composition.

12. The conductive adhesive according to claim 2, wherein the solder material further comprises at least one metal selected from the group consisting of 0.001 to 0.1 parts of Ge and 0.001 to 0.1 parts of Ni based on 100 parts of the basic composition.

13. The conductive adhesive according to claim 2, wherein the solder material further comprises 0.001 to 0.1 parts of Ge based on 100 parts of the basic composition.

14. The circuit board according to claim 7, wherein the solder material further comprises at least one metal selected from the group consisting of 0.001 to 0.1 parts of Ge and 0.001 to 0.1 parts of Ni based on 100 parts of the basic composition.

15. The circuit board according to claim 7, wherein the solder material further comprises 0.001 to 0.1 parts of Ge based on 100 parts of the basic composition.

* * * * *

UNITED STATES PATENT AND TRADEMARK OFFICE
CERTIFICATE OF CORRECTION

PATENT NO. : 8,293,370 B2
APPLICATION NO. : 12/376370
DATED : October 23, 2012
INVENTOR(S) : Atsushi Yamaguchi It is certified that error appears in the above-identified patent and that said Letters Patent is hereby corrected as shown below:

Please delete the following Bi et al. citation from section (56) on the front page of the patent:

"US 2006/0067582 A1"

Signed and Sealed this
Second Day of April, 2013

Teresa Stanek Rea
*Acting Director of the United States Patent and Trademark Office*